United States Patent
Chi et al.

(10) Patent No.: US 9,805,951 B1
(45) Date of Patent: Oct. 31, 2017

(54) METHOD OF INTEGRATION PROCESS FOR METAL CMP

(71) Applicant: Taiwan Semiconductor Manufacturing Co., Ltd., Hsin-Chu (TW)

(72) Inventors: Chih-Chien Chi, Hsinchu (TW); Pei-Hsuan Lee, Taipei (TW); Hung-Wen Su, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 14 days.

(21) Appl. No.: 15/099,779

(22) Filed: Apr. 15, 2016

(51) Int. Cl.
*H01L 21/44* (2006.01)
*H01L 21/321* (2006.01)
*H01L 21/288* (2006.01)
*H01L 21/311* (2006.01)
*H01L 21/027* (2006.01)
*H01L 21/768* (2006.01)

(52) U.S. Cl.
CPC ...... *H01L 21/3212* (2013.01); *H01L 21/0273* (2013.01); *H01L 21/2885* (2013.01); *H01L 21/31144* (2013.01); *H01L 21/7684* (2013.01); *H01L 21/76802* (2013.01); *H01L 21/76843* (2013.01); *H01L 21/76879* (2013.01)

(58) Field of Classification Search
CPC .................................................... H01L 21/44
See application file for complete search history.

(56) References Cited

U.S. PATENT DOCUMENTS

| | | | |
|---|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2014/0001574 A1 | 1/2014 | Chen et al. |
| 2014/0110755 A1 | 4/2014 | Colinge |
| 2014/0151812 A1 | 6/2014 | Liaw |

*Primary Examiner* — Marvin Payen
(74) *Attorney, Agent, or Firm* — Haynes and Boone, LLP

(57) ABSTRACT

A method of fabricating a semiconductor device is disclosed. The method includes forming a dielectric layer over a substrate. The substrate has an edge region and a center region. The method also includes forming a dielectric ring in the edge region, forming a metal layer over the center region of the substrate and over the dielectric ring in the edge region of the substrate and polishing the metal layer in the center region and the edge region to expose the dielectric ring in the edge region of the substrate.

20 Claims, 10 Drawing Sheets

METHOD OF INTEGRATION PROCESS FOR METAL CMP

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, improvements in preventing/reducing debris and/or particles on an wafer during a polishing process are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
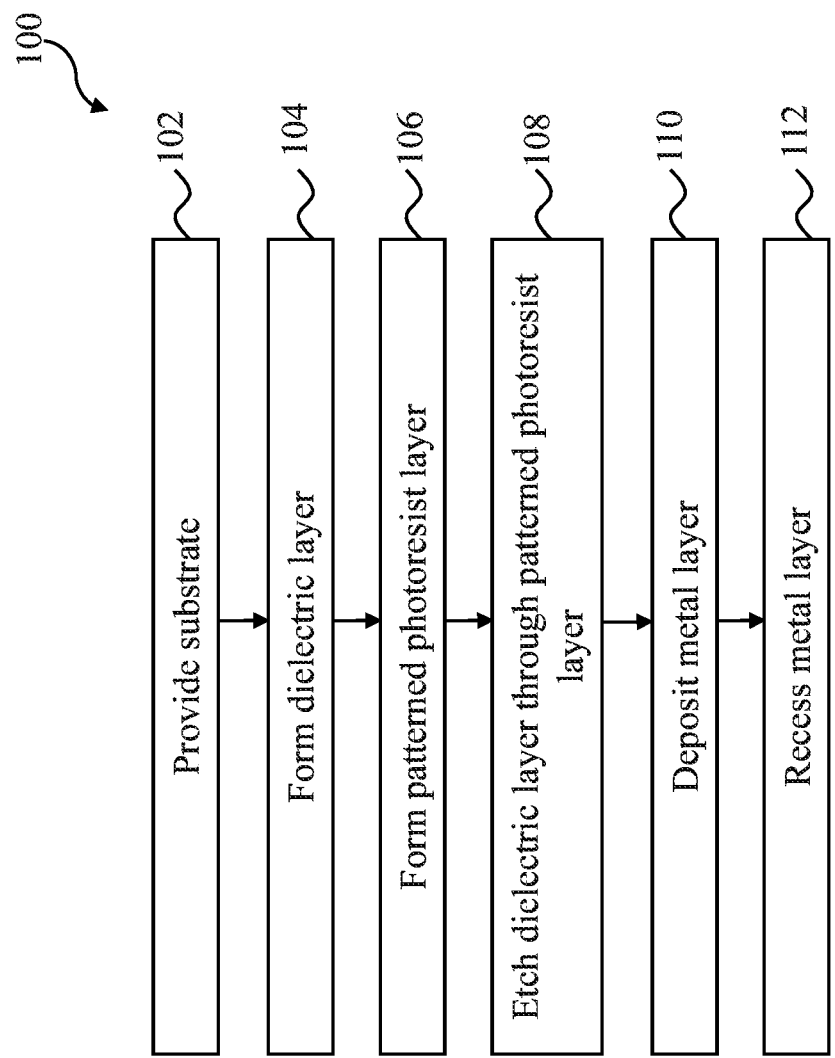
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2, 3A, 3B, 3C 4A, 4B, 5A, 5B and 6.

Figure 2:
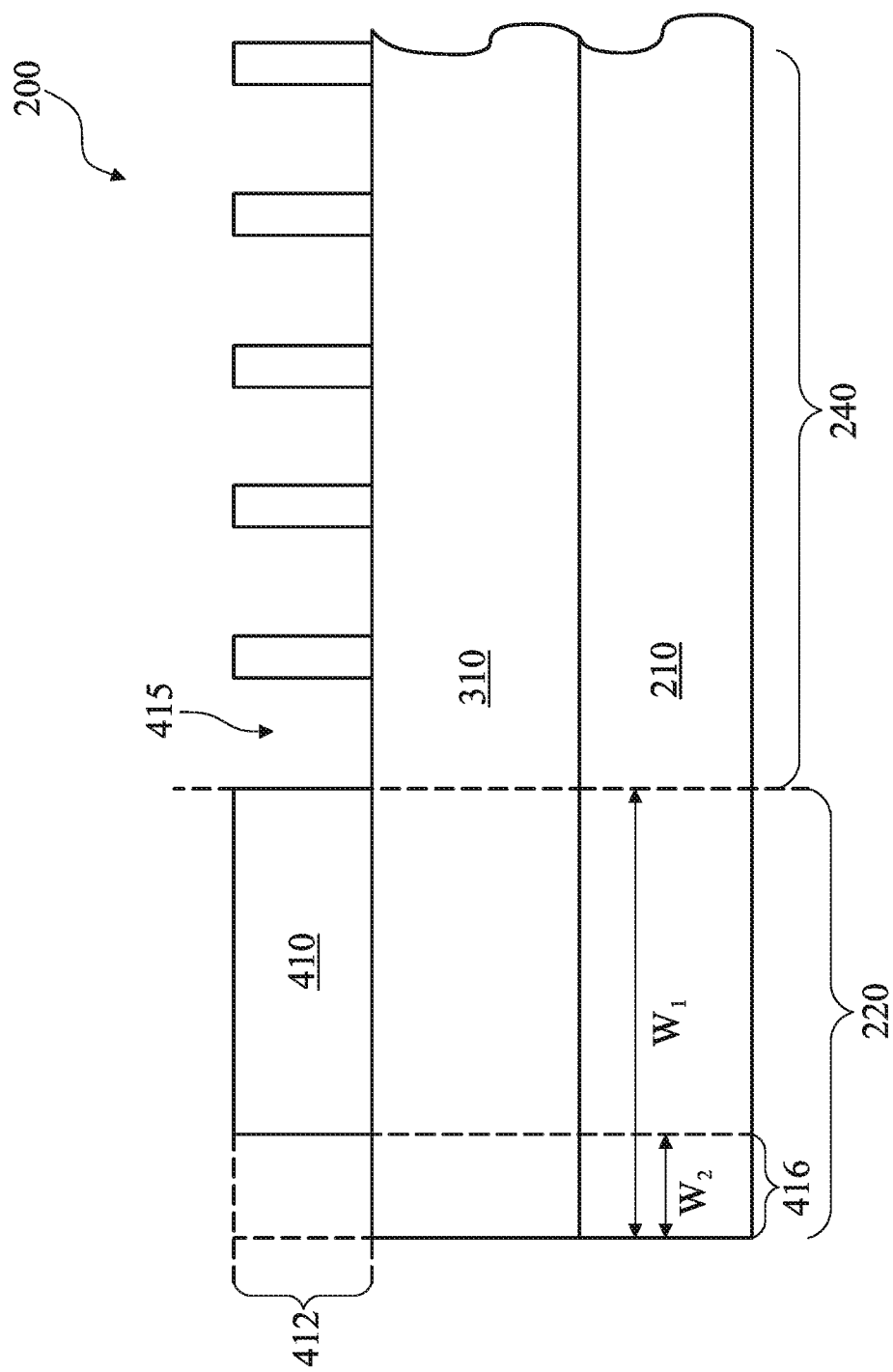
FIGS. 2, 3A, 3B, 4A, 4B, 5A and 6 are cross-sectional views of an example semiconductor device in accordance with some embodiments.

Referring to FIGS. 1 and 2, the method 100 begins at step 102 by providing a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of an STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, and/or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 420 may include Ti, Ag, Al, TiAlN, TaC, TaCN, TaSiN, Mn, Zr, TiN, TaN, Ru, Mo, Al, WN, Cu, W, any suitable materials and/or a combination thereof.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

In the present embodiment, the substrate 210 has an edge region 220 (e.g. wafer periphery) and a center region 240, which is adjacent to the edge region 220 and extends to a center of the substrate 210 (e.g. a center of the wafer).

Typically, during semiconductor fabrication, a substrate (e.g. the substrate 210) may be polished or planarized to remove a layer (e.g. a metal layer) or portion thereof above the substrate 210. One such process is known as chemical mechanical polishing (CMP). In a typical CMP process, the substrate 210 is supported by an apparatus, which presses the substrate 210 against a polishing pad (e.g., a rotating pad). Often the pad polishes the substrate 210 in the presence of polishing slurry, water, and/or other fluid. Typically a polishing rate for the CMP process is non-uniform in the edge region 220. That is, the edge region 220 experiences a higher polishing rate than the center region 240. This non-uniform polishing rate results in over-polishing the edge region 220. Thus, features formed in the edge region 220 prior to a polishing process may be over-polished abnormally and thereby become sources of defects, such as peeling off and particles/debris, in subsequent processes. The embodiment of the present disclosure provides an integration process to reduce defect generation in the edge region 220.

Referring again to FIGS. 1 and 2, method 100 proceeds to step 104 by forming a dielectric layer 310 over the substrate 210, including over both of the edge region 220 and the center region 240. The dielectric layer 310 may include silicon oxide, silicon nitride, silicon oxynitride, a low-k dielectric, silicon carbide, and/or other suitable materials. The dielectric layer 310 may be deposited by thermal oxidation chemical vapor deposition (CVD), atomic layer deposition (ALD), physical vapor deposition (PVD), thermal oxidation, combinations thereof, or other suitable techniques.

Referring again to FIGS. 1 and 2, method 100 proceeds to step 106 by patterning a photoresist layer 410 deposited over the dielectric layer 310 to form a patterned photoresist layer 412. In the present embodiment, the patterned photoresist layer 412 is formed such that the photoresist layer 410 covers the edge region 220 and a plurality of openings 415, according to an integrated circuit (IC) layout, is formed in the center region 240. The patterned photoresist layer 412 is formed by a lithography process. An exemplary lithography process may include forming the photoresist layer 410, exposing the photoresist layer 410 by a lithography exposure process, performing a post-exposure bake process, and developing the photoresist layer 410 to form the patterned photoresist layer 412. The photoresist layer 410 is deposited by spin-on coating technique, and/or other suitable techniques. During lithography exposure process, the solubility of the photoresist layer 410 is increased when photoresist layer is a positive tone photoresist. Alternatively, the solubility of photoresist layer 410 is decreased when photoresist layer 410 is a negative tone photoresist. The developing solution may remove the exposed or unexposed portions depending on the photoresist type (e.g. positive or negative tone). If the photoresist layer 410 is a positive-type resist, the exposed portions are dissolved by a developing solution and the unexposed portions remain over a substrate. If the photoresist layer 410 is a negative-type resist, the exposed portions are not dissolved by the developing solution and remain over the substrate.

In an embodiment, the photoresist layer 410 is a positive-type resist. The photoresist layer 410 in the edge region 220 and portions of the photoresist layer 410 in the center region 240 are blocked from the light source in a lithography exposure process. And therefore, the photoresist layer 410 in the edge region 220 remains and trenches 415 are formed after PEB and developing process. Alternatively, in another embodiment, the photoresist layer 410 is a negative-type resist. The photoresist layer 410 in the edge region 220 and portions of the photoresist layer 410 in the center region 240 are exposed by the light source in a lithography exposure process. And therefore, the photoresist layer 410 in the edge region 220 remains and trenches 415 are formed after PEB and developing process.

In the present embodiment, the edge region 220 has a first width $w_1$ designed to be greater than a width of the over-polishing in a subsequent polishing process. Additionally, the photoresist layer 410 over an edge bevel area 416 in the edge region 220 is removed by performing an edge bevel remover (EBR) process. An EBR solvent is dispensing through a nozzle while the substrate 210 is spinning during each of the plurality of speeds, wherein the photosensitive layer at the edge bevel area 416 is soluble in the solvent and thereby is removed. As an example, the EBR is performed by a coater tool equipped with top and bottom edge bevel solvent dispense nozzles. The edge bevel area 416 has a second width $w_2$, which is smaller than the first width $w_1$. In an embodiment, the second width $w_2$ is about 2 mm while the first width $w_1$ is in a range from about 15 mm to about 40 mm.

Referring to FIGS. 1, 3A, 3B and 3C, method 100 proceeds to step 108 by etching the dielectric layer 310 through the patterned photoresist layer 412. As a result, in the edge region 220, the portion of dielectric layer 310 covered by the photoresist layer 410 remains and forms while the openings 415 are transferred to a plurality of trenches 440 in the dielectric layer 310 in the center region 240. The etch process may include a wet etch, a dry etch, and/or a combination thereof. As an example, a wet etching solution may include $HNO_3$, $NH_4OH$, KOH, HF, HCl, NaOH, $H_3PO_4$, TMAH, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g. HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof.

Figure 3A:
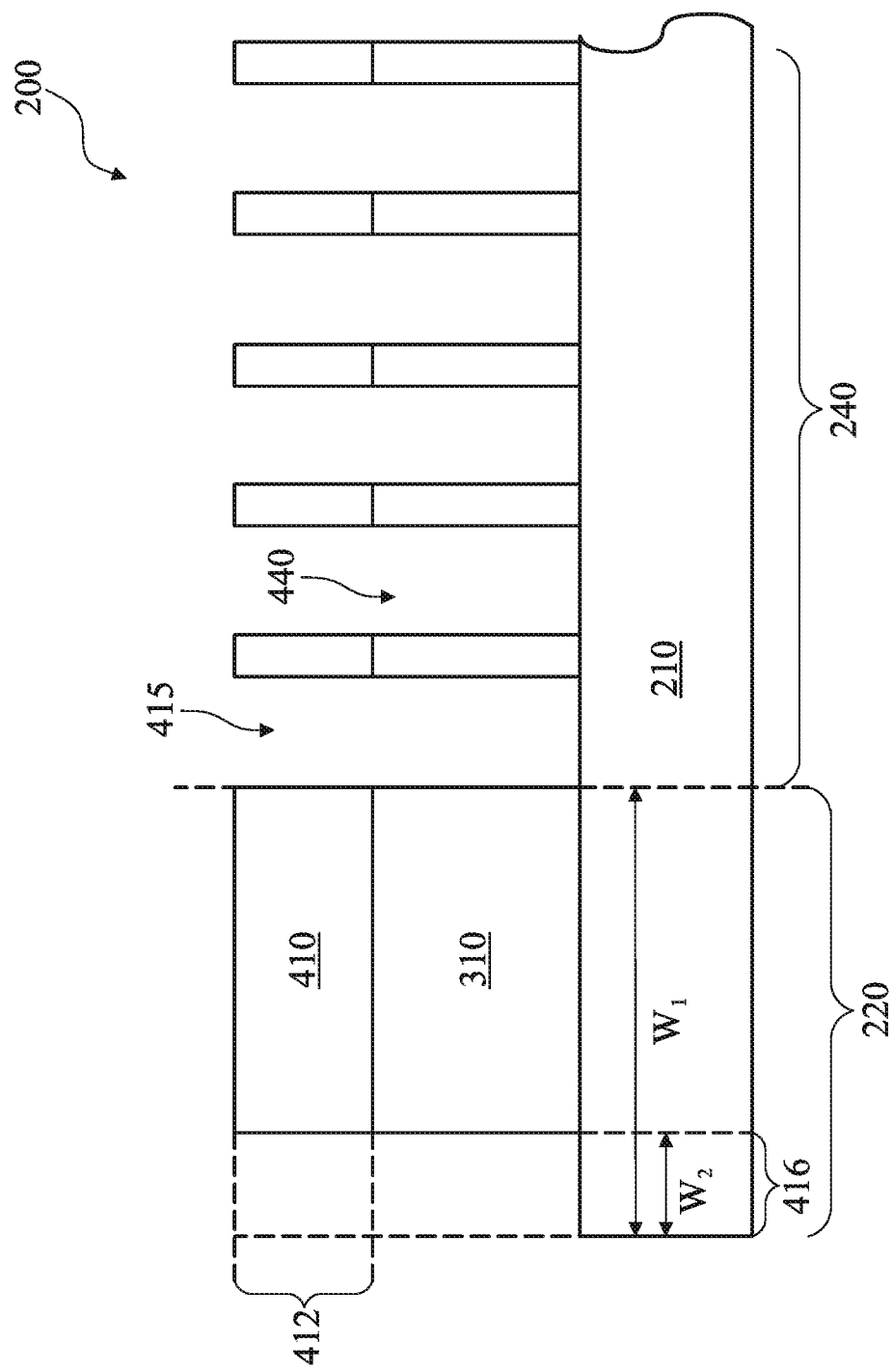
Figure 3B:
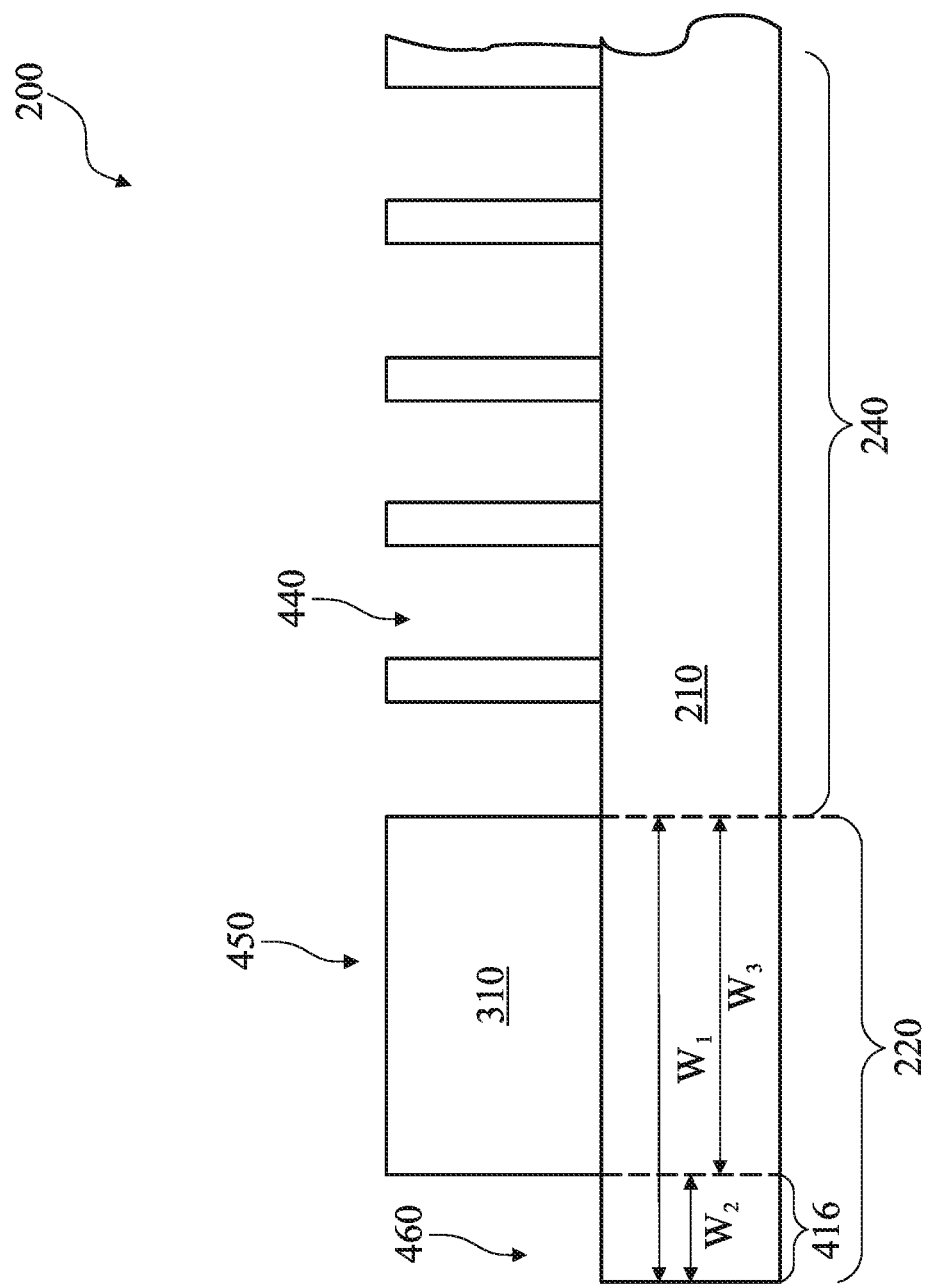
Figure 3C:
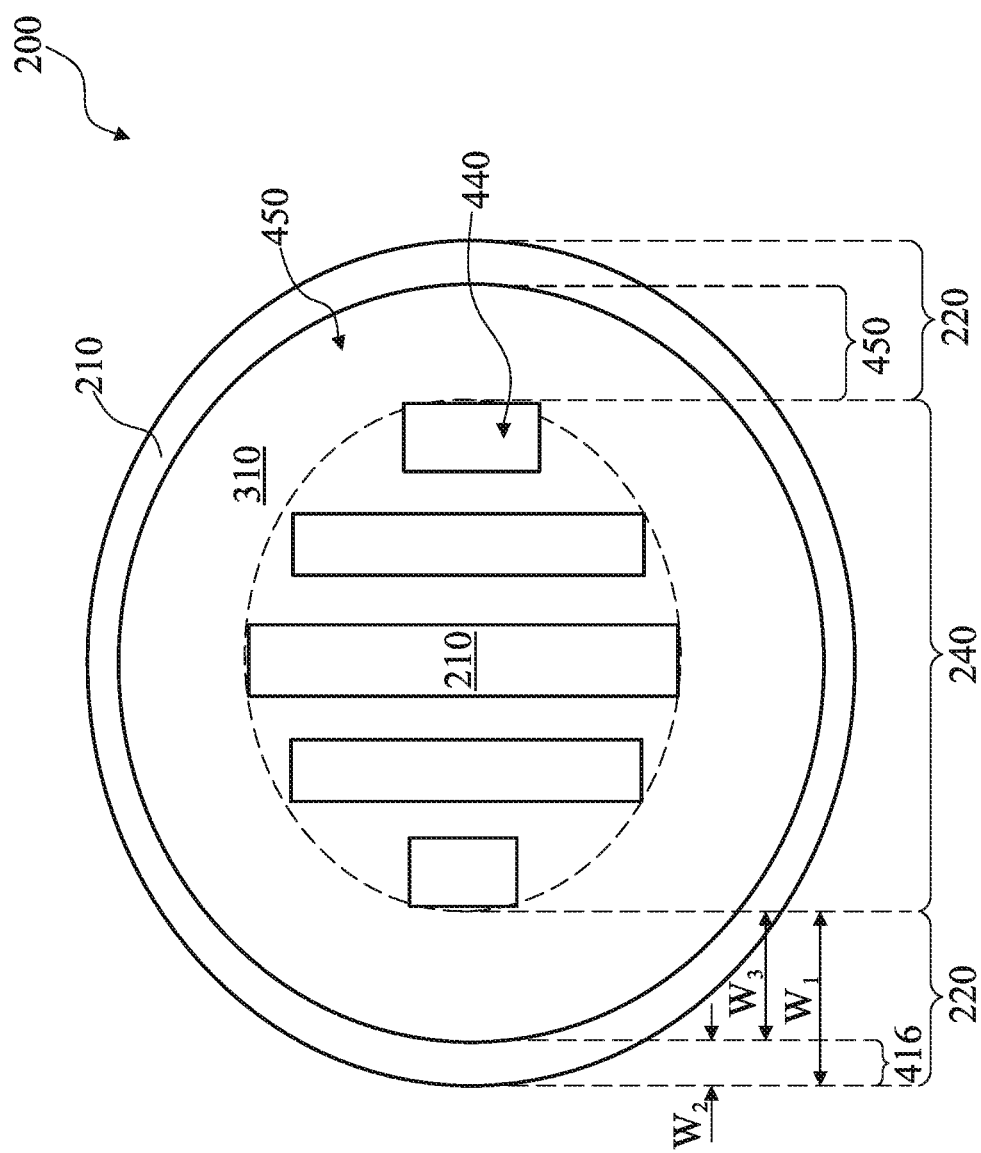
FIGS. 3C and 5B are top views of an example semiconductor device in accordance with some embodiments.

After forming the trenches 440, the pattered photoresist layer 412 is removed by wet stripping and/or plasma ashing, as shown in FIG. 3B. Thus, in the edge region 220, the remaining dielectric layer 310 forms a dielectric ring 450, as showed in FIG. 3C, which has a third width $w_3$ (being equal to ($w_1-w_2$)). At same time, the openings 415 is transferred to trenches 440 in the dielectric layer 310 in the center region 240 and the substrate 210 is exposed in the edge bevel area 416. The dielectric ring 450 spaces away from an edge of the substrate 210 by the edge bevel area 416, which has a distance, namely the second width $w_2$.

Figure 4A:
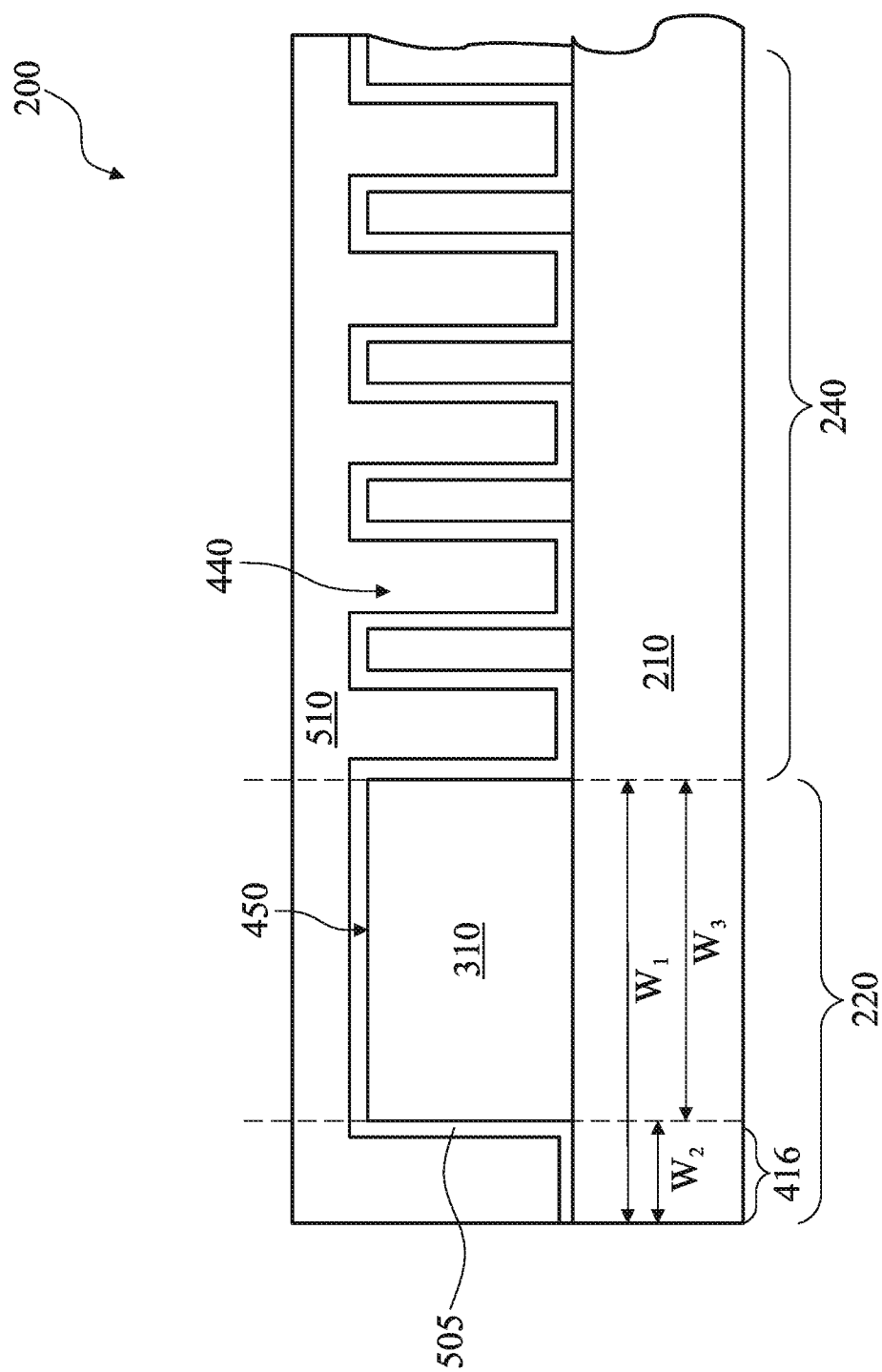
Figure 4B:
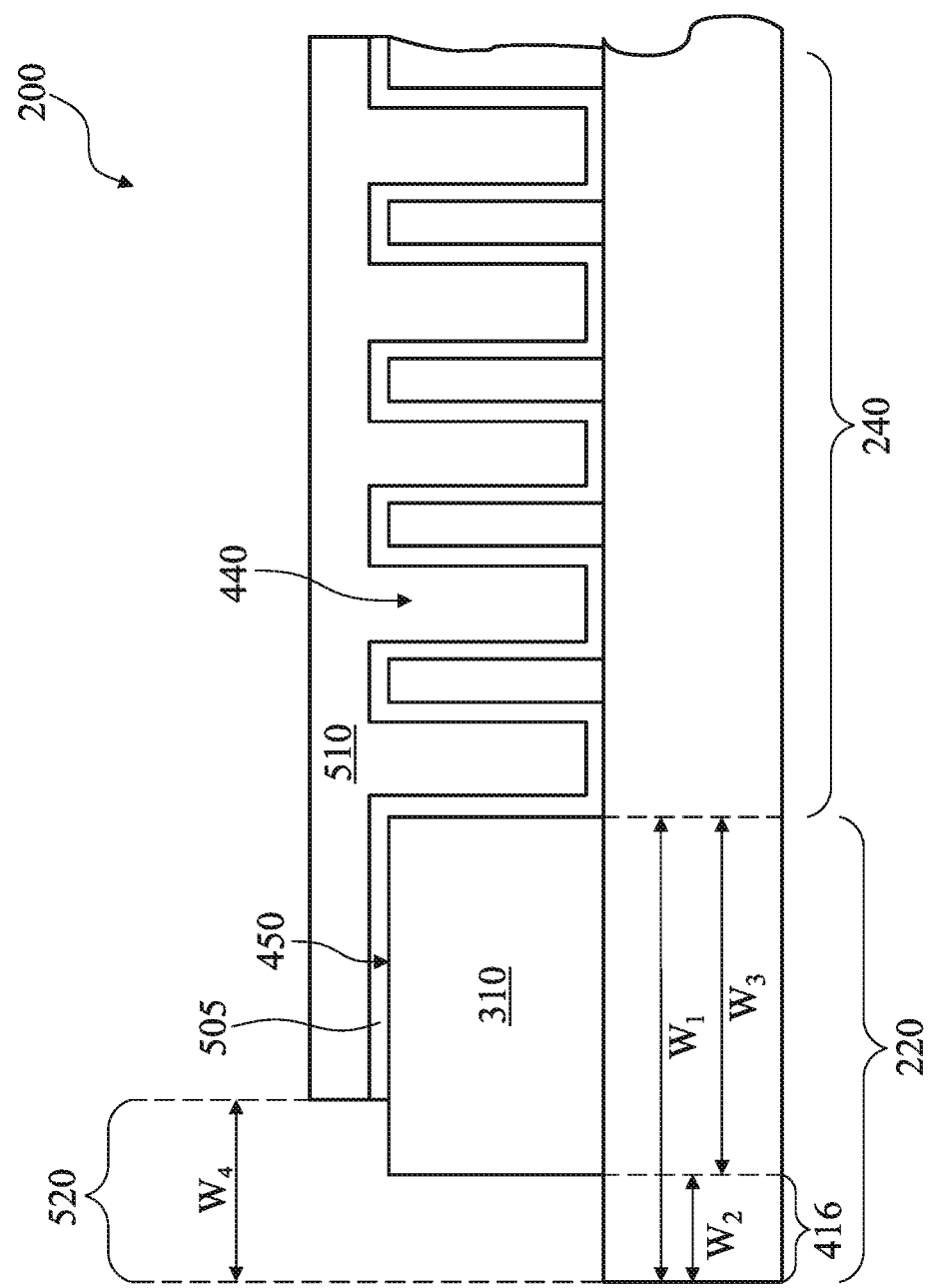

Referring to FIGS. 1, 4A and 4B, method 100 proceeds to step 110 by depositing a metal layer 510 over the substrate 210, including filling in trenches 440. The metal layer 510 may be a portion of the interconnect structure. As shown, the metal layer 510 is deposited over the dielectric ring 450 and the substrate 210 in the edge bevel area 416. In some embodiment, prior to depositing the metal layer 510, a barrier layer 505 is deposited in the plurality of trenches 440, including over the dielectric ring 450 and the substrate 210 in the dielectric edge bevel area 416. The barrier layer 505 may include refractory metals and their nitrides. In various examples, the barrier layer 410 includes of tantalum (Ta), tantalum nitride (TaN), titanium nitride (TiN), cobalt (Co), tungsten nitride (WN), titanium silicon nitride (TiSiN), and tantalum silicon nitride (TaSiN), or combinations thereof. The barrier layer 410 may include multiple films. The first tool includes a physical vapor deposition (PVD) tool, a chemical vapor deposition (CVD) too, a metal-organic chemical vapor deposition (MOCVD) tool and an atomic layer deposition (ALD) tool, or other suitable tools.

The metal layer 510 is then deposited over the barrier layer 505. The metal layer 510 may include copper or copper alloy, such as copper manganese (CuMn), copper aluminum (CuAl), copper titanium, (CuTi), copper vanadium (CuV), copper chromium (CuCr), copper silicon (CuSi) or copper niobium (CuNb), aluminum (Al), tungsten (W), and/or other suitable conductive material. The metal layer 510 may be deposited by ALD, PVD, CVD, metal-organic chemical vapor deposition (MOCVD), electrochemical plating (ECP), and/or other techniques.

In the present embodiment, the metal layer 510 is formed by electrochemical plating (ECP) in an ECP tool. In the ECP tool, the substrate 210 is submerged in an ECP electrolyte solution and the metal layer 510 is electroplated in an ECP electrolyte solution. The metal layer 510 is filled bottom-up the trenches 440 and also deposited over the dielectric ring 450 and the substrate 210 in the edge bevel area 416, as shown in FIG. 4A. In one embodiment, the metal layer 510 is a copper layer and deposited by ECP.

Additionally, as illustrated in FIG. 4B, an edge bevel of the metal layer 510 and barrier layer 505 in the edge region 220 is removed by a metal EBR solution in an EBR chamber of the ECP tool, which forms a metal EBR region 520. In some embodiments, a portion of the barrier layer 505 underneath the edge bevel of the metal layer 510 is removed at the same time. In an embodiment, the edge bevel of the copper layer 510 is removed by a mixture of sulfuric acid ($H_2SO_4$), hydrogen peroxide ($H_2O_2$), and deionized water in the EBR chamber of the ECP tool.

The metal EBR region 520 is designed to have a fourth width $w_4$, which is greater than the second width $w_2$ and smaller than the first width $w_1$. As an example, the fourth width $w_4$ is about is about 2.5 mm while the second width is about 2.0 mm and the first width $w_1$ is in a range from about 15 mm to about 40 mm. As a result, the substrate 210 is exposed again in the edge bevel 416.

Figure 5A:
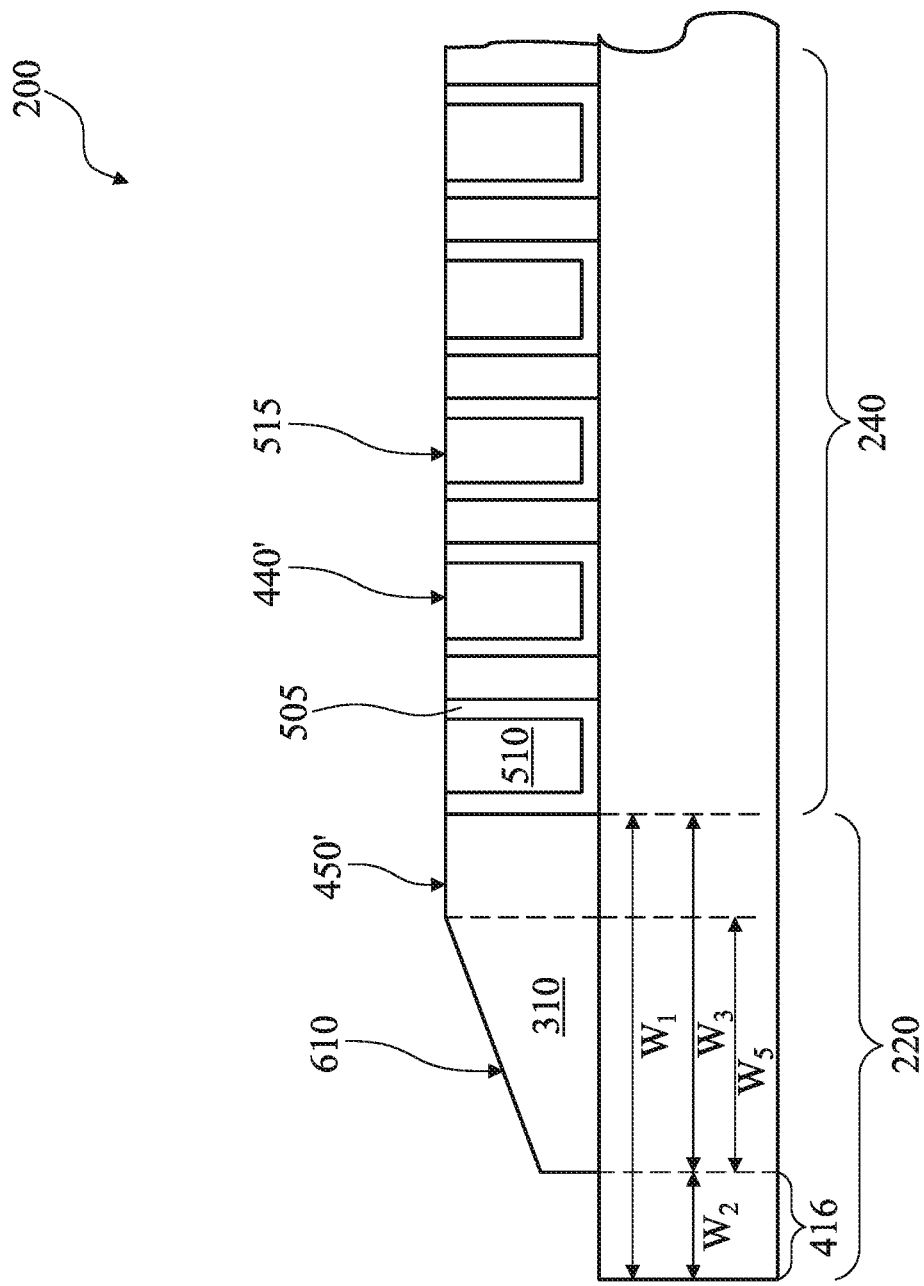
Figure 5B:
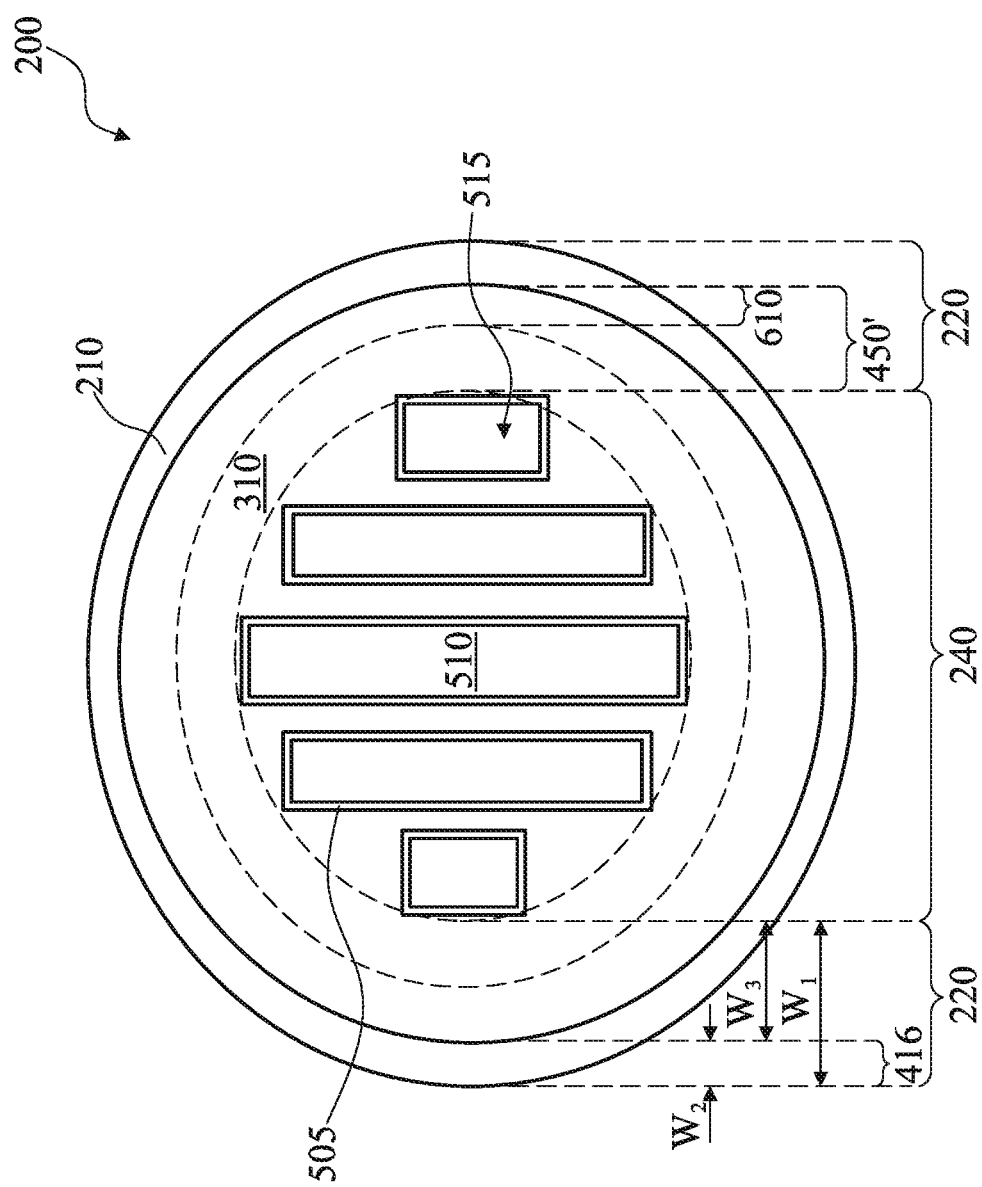
Figure 6:
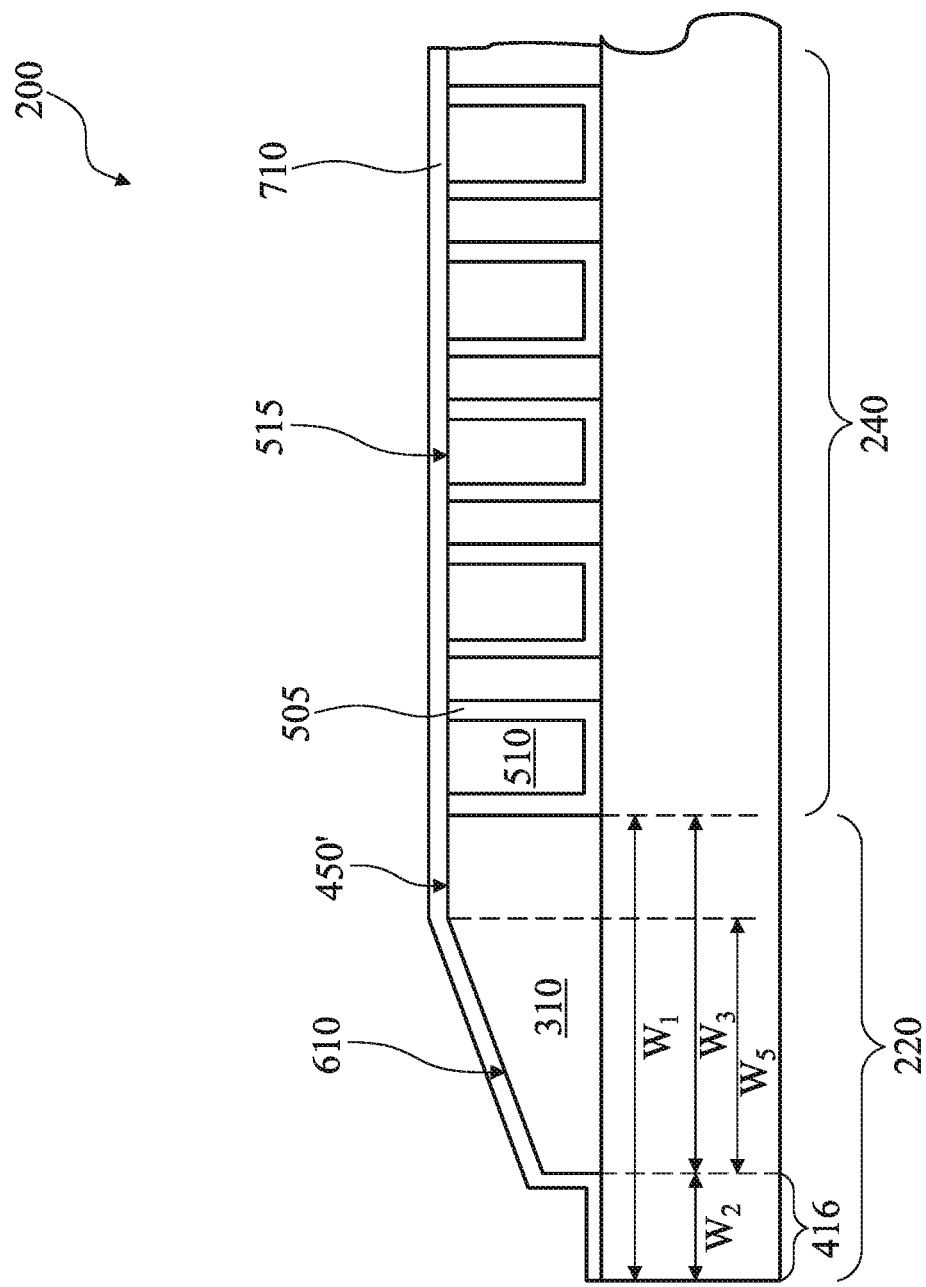

Referring to FIGS. 1, 5A and 5B, method 100 proceeds to step 112 by recessing the metal layer 510 to form metal features 515 in respective trenches 440. In the present embodiment, the metal layer 510 is recessed by a CMP process. A recess depth is controlled such that the metal layer 510, as well as the barrier layer 505, overlaying trenches 440 and the dielectric ring 450 is removed. A remaining metal layer 510 within respective trenches 440 forms respective metal features 515 and each of two adjacent metal features 515 is separated by the dielectric layer 310. The metal feature 515 may include a portion of the interconnect structure, (e.g. metal lines or contact metal features), which integrates with an ILD layer to provide electrical routing to couple various devices in the substrate 210 to the input/output power and signals.

Due to a higher etch rate in the edge region 220, an over-polishing region 610 is formed during the recessing process. As shown, a thickness of the dielectric ring 450 tapers (i.e. become thinner and thinner) towards the outside of the dielectric ring 450. With this non-uniform thickness, the dielectric ring 450 is referred to as 450'. In the present embodiment, the over-polishing region 610 has a fifth width $w_5$. As has been mentioned above, the first width $w_1$ is designed to be greater than the fifth width $w_5$. In other words, the over-polishing region 610 is within the dielectric ring 450', where no pattern (e.g. trenches) is formed, as shown in FIG. 5B. Thus, defect sources caused by over-polishing features in the edge region 220 are prevented/eliminated.

Additional steps can be provided before, during, and after the method 100, and some of the steps described can be replaced or eliminated for other embodiments of the method. As an example, referring to FIG. 6, an etch-stop-layer (ESL) 710 is formed over the substrate 210, including the metal feature 515, the dielectric ring 450' and the substrate 210 in the edge bevel area 416, to protect the metal feature 515 in a subsequent etching process. The ESL 710 may include silicon nitride, silicon oxide, a silicon oxynitride, silicon carbide, and/or other materials known in the art. The ESL 710 may be formed by PVD, CVD, ALD, and/or other suitable deposition processes.

Based on the above, the present disclosure offers methods for metal layer CMP integration. The method employs forming a dielectric ring in an edge region of a wafer while forming features in a center region of the wafer. The method defines a width of the dielectric ring is greater than a width of over-polish region in a metal polishing process. The method also employs performing edge bevel removal processes during dielectric ring formation and metal layer deposition. The method demonstrates preventing/eliminating defects source caused by metal over-polishing in the edge region.

The present disclosure provides many different embodiments of fabricating a semiconductor device that provide one or more improvements over existing approaches. In one embodiment, a method for fabricating a semiconductor device includes forming a dielectric layer over a substrate. The substrate has an edge region and a center region. The method also includes forming a dielectric ring in the edge region, forming a metal layer over the center region of the substrate and over the dielectric ring in the edge region of the substrate and polishing the metal layer in the center region and the edge region to expose the dielectric ring in the edge region of the substrate.

In another embodiment, a method includes forming a dielectric layer over a substrate. The substrate has an edge region and a center region. The method also includes patterning the dielectric layer to form a dielectric ring in the edge region of the substrate and a trench within the dielectric layer in the center region of the substrate. The method also includes forming a metal layer over the dielectric ring and within the trench and polishing the metal layer to remove the metal layer overlaying the dielectric ring and the metal layer from within the trench.

In yet another embodiment, a method includes forming a dielectric layer over a substrate. The substrate has an edge region and a center region. The method also includes forming a patterned photoresist layer over the dielectric layer such that the patterned photoresist layer covers the edge region of the substrate and has a plurality of openings in the center region. The method also includes etching the dielectric layer through the patterned photoresist layer to form a dielectric ring in the edge region and a plurality of trenches in the dielectric layer in the center region. The methods also includes forming a metal layer over the dielectric ring and within the plurality of trenches and performing a chemical mechanical polishing process to remove the metal layer overlaying the dielectric ring and from within the plurality of trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dielectric layer over a substrate, the substrate having an edge region and a center region;
    forming a dielectric ring in the edge region;
    forming a metal layer over the center region of the substrate and over the dielectric ring in the edge region of the substrate; and
    polishing the metal layer in the center region and the edge region to expose the dielectric ring in the edge region of the substrate.

2. The method of claim 1, wherein forming the dielectric ring in the edge region includes:
    forming a patterned photoresist layer over the dielectric layer, wherein the dielectric layer in the edge region is covered by the patterned photoresist layer; and
    etching the dielectric layer through the patterned photoresist layer.

3. The method of claim 2, wherein forming the patterned photoresist layer over the dielectric layer includes performing an edge-bevel-removal process.

4. The method of claim 1, further comprising forming a barrier layer over the dielectric ring.

5. The method of claim 1, further comprising performing an edge-bevel-removal process to remove a portion of the metal layer over the dielectric ring.

6. The method of claim 1, wherein forming the metal layer over the center region and over the dielectric ring in the edge region of the substrate includes forming the metal layer by electrochemical plating.

7. The method of claim 1, further comprising forming a barrier layer over the substrate prior to forming the metal layer over the center region of the substrate and over the dielectric ring in the edge region of the substrate.

8. The method of claim 1, wherein polishing the metal layer in the center region and the edge region to expose the dielectric ring in the edge region of the substrate includes performing a chemical mechanical polishing process to the metal layer.

9. A method comprising:
    forming a dielectric layer over a substrate, the substrate having an edge region and a center region;
    patterning the dielectric layer to form a dielectric ring in the edge region of the substrate and a trench within the dielectric layer in the center region of the substrate;
    forming a metal layer over the dielectric ring and within the trench; and
    polishing the metal layer to remove the metal layer overlaying the dielectric ring and the metal layer from within the trench.

10. The method of claim 9, wherein patterning the dielectric layer to form the dielectric ring in the edge region of the substrate and the trench within dielectric layer in the center region of the substrate includes:
    forming a patterned photoresist layer over the dielectric layer, wherein the dielectric layer in the edge region is covered by the patterned photoresist layer, wherein the patterned photoresist layer has an opening in the center region; and
    etching the dielectric layer through the patterned photoresist layer.

11. The method of claim 10, wherein forming a patterned photoresist layer over the dielectric layer includes performing an edge-bevel-removal process.

12. The method of claim 9, wherein forming the metal layer over the dielectric ring and filling in the trench includes performing an edge-bevel-removal to remove the metal layer from out-site portion of the dielectric ring.

13. The method of claim 9, wherein forming the metal layer over the dielectric ring and within the trench includes forming the metal layer by electrochemical plating.

14. The method of claim 9, further comprising forming a barrier layer over the substrate prior to forming the metal layer over the dielectric ring and within the trench.

15. The method of claim 9, wherein polishing the metal layer includes applying a chemical mechanical polishing process to the metal layer.

16. The method of claim 9, further comprising:
    after polishing the metal layer, forming an etch-stop-layer over the substrate, including the remaining metal layer and the dielectric ring.

17. A method comprising:
    forming a dielectric layer over a substrate, the substrate having an edge region and a center region;
    forming a patterned photoresist layer over the dielectric layer such that the patterned photoresist layer covers the edge region of the substrate and has a plurality of openings in the center region;
    etching the dielectric layer through the patterned photoresist layer to form a dielectric ring in the edge region and a plurality of trenches in the dielectric layer in the center region;

forming a metal layer over the dielectric ring and within the plurality of trenches; and performing a chemical mechanical polishing process to remove the metal layer overlaying the dielectric ring and from within the plurality of trenches.

18. The method of claim 17, wherein forming the patterned photoresist layer over the dielectric layer includes performing an edge-bevel-removal process.

19. The method of claim 17, wherein forming the metal layer over the dielectric ring and within the plurality of trenches includes forming the metal layer by electrochemical plating.

20. The method of claim 19, wherein forming the metal layer over the dielectric ring includes performing an edge-bevel-removal process to expose a portion of the dielectric ring.

* * * * *